United States Patent
Horita et al.

(10) Patent No.: US 11,352,593 B2
(45) Date of Patent: Jun. 7, 2022

(54) AQUEOUS COMPOSITION AND CLEANING METHOD USING SAME

(71) Applicant: MITSUBISHI GAS CHEMICAL COMPANY, INC., Chiyoda-ku (JP)

(72) Inventors: Akinobu Horita, Katsushika-ku (JP); Toshiyuki Oie, Katsushika-ku (JP); Takahiro Kikunaga, Katsushika-ku (JP); Kenji Yamada, Katsushika-ku (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 20 days.

(21) Appl. No.: 17/047,571

(22) PCT Filed: Apr. 25, 2019

(86) PCT No.: PCT/JP2019/017588
§ 371 (c)(1),
(2) Date: Oct. 14, 2020

(87) PCT Pub. No.: WO2019/208686
PCT Pub. Date: Oct. 31, 2019

(65) Prior Publication Data
US 2021/0155881 A1    May 27, 2021

(30) Foreign Application Priority Data
Apr. 27, 2018    (JP) .............................. JP2018-086662

(51) Int. Cl.
*C11D 7/08*    (2006.01)
*C11D 7/28*    (2006.01)
(Continued)

(52) U.S. Cl.
CPC ................. *C11D 7/28* (2013.01); *C11D 7/08* (2013.01); *C11D 7/36* (2013.01); *C11D 11/0047* (2013.01); *C23F 1/16* (2013.01)

(58) Field of Classification Search
CPC ................................................... C11D 11/0047
(Continued)

(56) References Cited

U.S. PATENT DOCUMENTS

| | | | |
|---|---|---|---|
| 2009/0065735 A1* | 3/2009 | Kolics ................. | C11D 7/3281 252/79.1 |
| 2011/0021400 A1* | 1/2011 | Mizuta .................... | G03F 7/426 510/176 |

(Continued)

FOREIGN PATENT DOCUMENTS

| JP | 2006-83376 A | 3/2006 |
|---|---|---|
| JP | 2013-533631 A | 8/2013 |

(Continued)

OTHER PUBLICATIONS

Extended European Search Report dated May 18, 2021 in corresponding European Patent Application No. 19793812.9, 12 pages.

(Continued)

*Primary Examiner* — Gregory E Webb
(74) *Attorney, Agent, or Firm* — Oblon, McClelland, Maier & Neustadt, L.L.P.

(57) ABSTRACT

An aqueous composition may include: (A) a fluoride ion supply source in an amount that gives a fluoride ion concentration of 0.05 to 30 mmol/L in the composition; (B) a cation supply source in an amount that gives a mole ratio of cations of 0.3 to 20 to the fluoride ions in the composition; and (C) 0.0001 to 10 mass % of one or more compounds selected from a $C_{4-13}$ alkylphosphonic acid, a $C_{4-13}$ alkylphosphonate ester, a $C_{4-13}$ alkyl phosphate and a salt (Continued)

thereof, with respect to the total amount of the composition, wherein pH is in a range of from 2 to 6.

18 Claims, 1 Drawing Sheet

(51) Int. Cl.
*C11D 7/36* (2006.01)
*C11D 11/00* (2006.01)
*C23F 1/16* (2006.01)

(58) Field of Classification Search
USPC .......................................................... 510/175
See application file for complete search history.

(56) References Cited

U.S. PATENT DOCUMENTS

| | | |
|---|---|---|
| 2013/0296214 A1 | 11/2013 | Barnes et al. |
| 2015/0075570 A1* | 3/2015 | Wu ...................... C11D 3/0073 134/41 |
| 2015/0337245 A1 | 11/2015 | Hayama et al. |
| 2016/0130500 A1 | 5/2016 | Chen et al. |
| 2017/0200619 A1* | 7/2017 | Cooper ............. H01L 21/31133 |
| 2019/0071623 A1 | 3/2019 | Kamimura et al. |
| 2021/0002591 A1* | 1/2021 | Oie ........................... C11D 7/32 |
| 2021/0047593 A1* | 2/2021 | Oie ........................... C11D 7/10 |
| 2021/0155881 A1* | 5/2021 | Horita ....................... C23F 1/16 |

FOREIGN PATENT DOCUMENTS

| | | |
|---|---|---|
| JP | 2016-171294 A | 9/2016 |
| JP | 2016-527707 A | 9/2016 |
| JP | 2017-25326 A | 2/2017 |
| JP | 2017-519862 A | 7/2017 |
| JP | WO 2018/061365 A1 | 4/2018 |
| JP | WO 2018/061670 A1 | 4/2018 |
| WO | WO 2017/208749 A1 | 12/2017 |

OTHER PUBLICATIONS

Padmanaban, M. et al., "Progress in Spin-on Hard Mask Materials for Advanced Lithography," Journal of Photopolymer Science and Technology, vol. 27, No. 4, 2014, pp. 503-509.
International Search Report dated Jul. 2, 2019 in PCT/JP2019/017588 dated Apr. 25, 2019, 2 pages.

\* cited by examiner

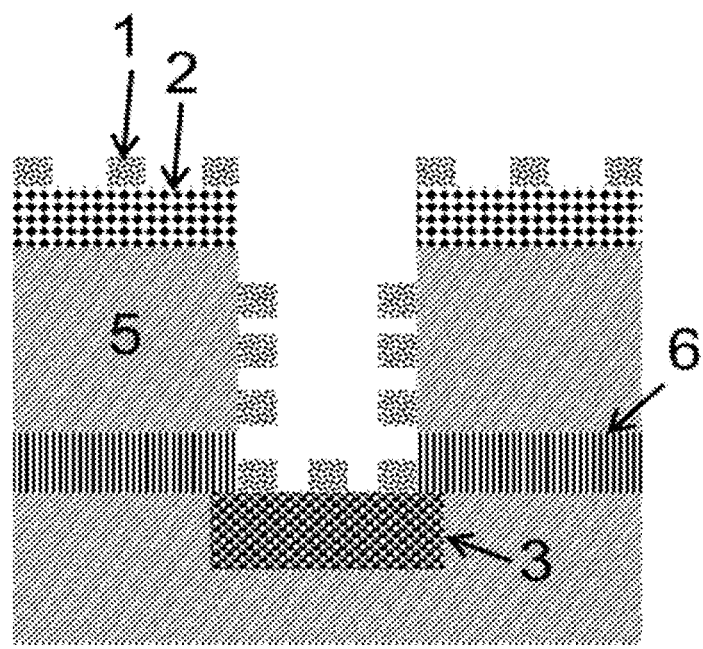

ical Field

The present invention relates to an aqueous composition and a cleaning method using the same, for example, a cleaning composition used in a production process of an electronic device (for example, a semiconductor element) and a cleaning method using the same.

BACKGROUND ART

In a process of producing an electronic device such as a semiconductor element, a dry etching process is usually employed upon forming a semiconductor integrated circuit. During this dry etching process, dry etch residues (a zirconium-based residue, a titanium-based residue, a polymer residue, etc.) are generated, which need to be removed. It is preferable that a cleaning agent used for removing such dry etch residues does not adversely affect (for example, corrode) the metal line material (for example, copper, titanium, cobalt, tungsten, etc.) used in the semiconductor integrated circuit targeted for cleaning.

A variety of cleaning agents have been developed from these points of view. For example, cleaning compositions for removing dry etch residues remaining after dry etching, cleaning methods using the same, and the like are disclosed in Patent documents 1, 2 and 3, and else.

A hardmask is sometimes used during the process of forming a semiconductor integrated circuit. While silicon- and titanium-based materials have been conventionally employed as the materials of such hardmasks, zirconia-based hardmasks are recently proposed as well (Non-patent document 1).

PRIOR ART DOCUMENTS

Patent Documents

Patent document 1: Japanese Unexamined Patent Application Publication (translation of PCT) No. 2013-533631
Patent document 2: Japanese Unexamined Patent Application Publication No. 2016-171294
Patent document 3: Japanese Unexamined Patent Application Publication No. 2006-83376

Non-Patent Documents

Non-patent document 1: M Padmanaban et al, J. Photopolym. Sci. Technol., 27 (2014), 503

SUMMARY OF THE INVENTION

Problems to be Solved by the Invention

Since various metal line materials may be used in an electronic devices and various masking materials may be used upon dry etching, and combinations thereof can vary, there is a need for development of a novel cleaning composition in view of efficiently removing dry etch residues, effectively preventing corrosion of metal line materials and else.

Means for Solving the Problems

The present invention provides an aqueous composition, a cleaning method using the same and the like below.

[1] An aqueous composition comprising:
(A) a fluoride ion supply source in an amount that gives a fluoride ion (for example, $F^-$) concentration of 0.05-30 mmol/L in the composition;
(B) a cation supply source in an amount that gives a mole ratio of cations of 0.3-20 to the fluoride ions in the composition; and
(C) 0.0001-10 mass % of one or more kinds of compounds selected from a $C_{4-13}$ alkylphosphonic acid, a $C_{4-13}$ alkylphosphonate ester, a $C_{4-13}$ alkyl phosphate and a salt thereof, with respect to the total amount of the composition, wherein pH is in a range of 2-6 (for example, 2-5, 2-4 or 2-3).

[2] The aqueous composition according to [1] above, wherein the fluoride ion supply source of Component (A) is hydrogen fluoride, ammonium fluoride, ammonium hydrogen fluoride (ammonium hydrogen difluoride), tetramethylammonium fluoride, tetraethylammonium fluoride, tetrapropylammonium fluoride, tetrabutylammonium fluoride, lithium fluoride, sodium fluoride, potassium fluoride, potassium bifluoride (potassium hydrogen difluoride), rubidium fluoride, cesium fluoride, beryllium fluoride, magnesium fluoride, strontium fluoride, barium fluoride or a mixture thereof.

[3] The aqueous composition according to [1] or [2] above, wherein the cation supply source of Composition (B) is a lithium compound, a sodium compound, a potassium compound, a rubidium compound, a cesium compound, a beryllium compound, a magnesium compound, a strontium compound, a barium compound, an ammonium compound, a tetramethylammonium compound, a tetraethylammonium compound, a tetrapropylammonium compound, a tetrabutylammonium compound or a mixture thereof (provided that fluorine-containing compounds are excluded).

[4] The aqueous composition according to any one of [1]-[3] above, wherein the aqueous composition comprises at least one selected from:
n-butylphosphonic acid, n-pentylphosphonic acid, n-hexylphosphonic acid, n-heptylphosphonic acid, n-octylphosphonic acid, n-nonylphosphonic acid, n-decylphosphonic acid, n-undecylphosphonic acid, n-dodecylphosphonic acid, n-tridecylphosphonic acid or a mixture thereof, as the alkylphosphonic acid;
n-butylphosphonate ester, n-pentylphosphonate ester, n-hexylphosphonate ester, n-heptylphosphonate ester, n-octylphosphonate ester, n-nonylphosphonate ester, n-decylphosphonate ester, n-undecylphosphonate ester, n-dodecylphosphonate ester, n-tridecylphosphonate ester or a mixture thereof, as the alkylphosphonate ester; and
salts of said alkylphosphonic acid or said alkylphosphonate ester.

[4a] The aqueous composition according to any one of [1]-[4] above, wherein the alkylphosphonic acid is a $C_{5-12}$ alkylphosphonic acid (preferably a $C_{5-11}$ alkylphosphonic acid, more preferably a $C_{5-9}$ alkylphosphonic acid, and still more preferably a $C_{6-8}$ alkylphosphonic acid), and the alkylphosphonate ester is an ester of these alkylphosphonic acids.

[5] The aqueous composition according to any one of [1]-[3] above, wherein the aqueous composition comprises at least one selected from:
n-butyl phosphate, n-pentyl phosphate, n-hexyl phosphate, n-heptyl phosphate, n-octyl phosphate, n-nonyl phosphate, n-decyl phosphate, n-undecyl phosphate, n-dodecyl phosphate, n-tridecyl phosphate, 2-ethylhexyl phosphate, isodecyl phosphate or a mixture thereof, as the alkyl phosphate; and salts of said alkyl phosphate.

[5a] The aqueous composition according to any one of [1]-[5] above, wherein the alkyl phosphate is a $C_{4-13}$ alkyl phosphate (preferably a $C_{5-11}$ alkyl phosphate, more preferably a $C_{5-9}$ alkyl phosphate, and still more preferably a $C_{6-8}$ alkyl phosphate).

[5b] The aqueous composition according to any one of [1]-[5a] above, which is a dry etch residue removing composition used for removing a residue remaining after dry etching (for example, a zirconia-based dry etch residue).

[5c] The aqueous composition according to any one of [1]-[5b] above, which is a composition for preventing corrosion of a line material (for example, cobalt, a cobalt alloy or the like) of an electronic device targeted for cleaning.

[5d] The aqueous composition according to any one of [1]-[5c] above, wherein dodecylphosphonic acid is excluded from the alkylphosphonic acid.

[5e] The aqueous composition according to any one of [1]-[5d] above, wherein the concentration of the fluoride ion supplied from the fluoride ion supply source is 0.05-30 mmol/L (preferably 0.25-20 mmol/L, more preferably 0.5-5 mmol/L) in the composition, and the cations supplied from the cation supply source are contained in an amount that gives a mole ratio of cations of 0.3-20 to the fluoride ions.

[6] A method for cleaning an electronic device, which comprises the step of bringing the aqueous composition according to any one of [1]-[5e] above into contact with the electronic device.

[7] A method for producing an electronic device, which comprises the step of bringing the composition according to any one of [1]-[5e] above into contact with the electronic device.

[8] An etching solution comprising the composition according to any one of [1]-[5e] above.

[9] A cleaning solution comprising the composition according to any one of [1]-[5e] above.

Advantageous Effect of the Invention

An aqueous composition in a preferred aspect of the present invention is capable of efficiently removing dry etch residues (for example, a zirconium-based dry etch residue, a titanium-based dry etch residue, a polymer-based dry etch residue, etc.) while preventing corrosion of an etch stop film such as silicon nitride, an interlayer insulating film, a metal line material such as cobalt or a cobalt alloy and the like.

Since a cleaning method in a preferred aspect of the present invention has a favorable effect of preventing corrosion of an etch stop film such as silicon nitride, an interlayer insulating film, a metal line material such as cobalt or a cobalt alloy and the like, and has a favorable effect of removing dry etch residues, it allows production of a high precision, high quality electronic device such as a semiconductor element at high yield in a production process of said electronic device.

BRIEF DESCRIPTION OF THE DRAWINGS

FIG. 1 A cross-sectional schematic view of a semiconductor element of one embodiment before removing dry etch residue 1, the element comprising a structure including a zirconia-based hardmask 2, cobalt or a cobalt alloy 3, a low dielectric interlayer insulating film 5 and silicon nitride 6.

EMBODIMENTS FOR CARRYING OUT THE INVENTION

An aqueous composition of the present invention comprises:

(A) a fluoride ion supply source in an amount that gives a fluoride ion (for example, $F^-$) concentration of 0.05-30 mmol/L in the composition;

(B) a cation supply source in an amount that gives a mole ratio of cations of 0.3-20 to the fluoride ions in the composition; and (C) 0.0001-10 mass % of one or more kinds of compounds selected from a $C_{4-13}$ alkylphosphonic acid, a $C_{4-13}$ alkylphosphonate ester, a $C_{4-13}$ alkyl phosphate and a salt thereof, with respect to the total amount of the composition, wherein pH is in a range of 2-6.

Hereinafter, an aqueous composition of the present invention will be described in detail.

[Component (A): Fluoride Ion Supply Source]

A fluoride ion supply source used in the present invention is not particularly limited as long as it can supply fluoride ions. Examples of the fluoride ion supply source used here include hydrogen fluoride, ammonium fluoride, ammonium hydrogen fluoride, tetramethylammonium fluoride, tetraethylammonium fluoride, tetrapropylammonium fluoride, tetrabutylammonium fluoride, lithium fluoride, sodium fluoride, potassium fluoride, potassium bifluoride, rubidium fluoride, cesium fluoride, beryllium fluoride, magnesium fluoride, strontium fluoride, barium fluoride or a mixture thereof. Among them, hydrogen fluoride, ammonium fluoride, ammonium hydrogen fluoride, tetramethylammonium fluoride, potassium fluoride and potassium bifluoride are particularly preferable.

The fluoride ion supply source is added such that the concentration of the fluoride ion in the aqueous composition is 0.05-30 mmol/L when the composition is used as a cleaning solution or the like. The concentration of the fluoride ion in the composition is preferably 0.25-20 mmol/L, more preferably 0.5-5 mmol/L and still more preferably 1.0-2.5 mmol/L. For example, the amount of the fluoride ion supply source added is usually 0.001-0.6 mass %, preferably 0.005-0.5 mass % and more preferably 0.02-0.4 mass % in the composition in terms of hydrogen fluoride.

[Composition (B): Cation Supply Source]

The cation supply source used in the present invention is not particularly limited, and examples thereof include a lithium compound, a sodium compound, a potassium compound, a rubidium compound, a cesium compound, a beryllium compound, a magnesium compound, a strontium compound, a barium compound, an ammonium compound, a tetramethylammonium compound, a tetraethylammonium compound, a tetrapropylammonium compound, a tetrabutylammonium compound or a mixture thereof.

Examples of a preferable lithium compound include lithium hydroxide, lithium nitrate, lithium sulfate, lithium chloride, lithium tetrafluorophosphate, lithium phosphate and lithium acetate.

Examples of a preferable sodium compound include sodium hydroxide, sodium nitrate, sodium sulfate, sodium chloride, sodium tetrafluorophosphate, sodium phosphate and sodium acetate.

Examples of a preferable potassium compound include potassium hydroxide, potassium nitrate, potassium sulfate, potassium chloride, potassium tetrafluorophosphate, potassium hexafluorophosphate, potassium phosphate and potassium acetate.

Examples of a preferable rubidium compound include rubidium hydroxide, rubidium nitrate, rubidium sulfate, rubidium chloride, rubidium tetrafluorophosphate, rubidium phosphate and rubidium acetate.

Examples of a preferable cesium compound include cesium hydroxide, cesium nitrate, cesium sulfate, cesium chloride, cesium tetrafluorophosphate, cesium phosphate and cesium acetate.

Examples of a preferable beryllium compound include beryllium hydroxide, beryllium nitrate, beryllium sulfate, beryllium chloride, beryllium tetrafluorophosphate, beryllium phosphate and beryllium acetate.

Examples of a preferable magnesium compound include magnesium hydroxide, magnesium nitrate, magnesium sulfate, magnesium chloride, magnesium tetrafluorophosphate, magnesium phosphate and magnesium acetate.

Examples of a preferable strontium compound include strontium hydroxide, strontium nitrate, strontium sulfate, strontium chloride, strontium tetrafluorophosphate, strontium phosphate and strontium acetate.

Examples of a preferable barium compound include barium hydroxide, barium nitrate, barium sulfate, barium chloride, barium tetrafluorophosphate, barium phosphate and barium acetate.

Examples of a preferable ammonium compound include ammonia, ammonium nitrate, ammonium sulfate, ammonium chloride, ammonium tetrafluorophosphate, ammonium phosphate and ammonium acetate.

Examples of a preferable tetramethylammonium compound include tetramethylammonium hydroxide, tetramethylammonium nitrate, tetramethylammonium sulfate, tetramethylammonium chloride, tetramethylammonium tetrafluorophosphate, tetramethylammonium phosphate and tetramethylammonium acetate.

Examples of a preferable tetraethylammonium compound include tetraethylammonium hydroxide, tetraethylammonium nitrate, tetraethylammonium sulfate, tetraethylammonium chloride, tetraethylammonium tetrafluorophosphate, tetraethylammonium phosphate and tetraethylammonium acetate.

Examples of a preferable tetrapropylammonium compound include tetrapropylammonium hydroxide, tetrapropylammonium nitrate, tetrapropylammonium sulfate, tetrapropylammonium chloride, tetrapropylammonium tetrafluorophosphate, tetrapropylammonium phosphate and tetrapropylammonium acetate.

Examples of a preferable tetrabutylammonium compound include tetrabutylammonium hydroxide, tetrabutylammonium nitrate, tetrabutylammonium sulfate, tetrabutylammonium chloride, tetrabutylammonium tetrafluorophosphate, tetrabutylammonium phosphate and tetrabutylammonium acetate.

Among them, ammonium nitrate, potassium nitrate, potassium sulfate, potassium hexafluorophosphate, tetramethylammonium nitrate, lithium sulfate, rubidium sulfate and potassium hydroxide are particularly preferable.

The cation supply source is added such that the mole ratio of cations to the fluoride ions in the aqueous composition (molar concentration of cation/molar concentration of fluoride ion) is 0.3-20, preferably 0.4-20, more preferably 0.5-10 and still more preferably 0.6-8 when the composition is used as a cleaning solution or the like. In another embodiment of the present invention, the lower limit of the above-mentioned mole ratio is 0.1 or 0.2. For example, the amount of the cation supply source added is usually in a range of 0.020-2.00 mass %, preferably 0.025-1.50 mass % and more preferably 0.05-1.0 mass % with respect to the total amount of the composition.

Herein, in the calculation of the above-mentioned mole ratio of cations to the fluoride ions (molar concentration of cation/molar concentration of fluoride ion), protons derived from Component (A) are not included in the "molar concentration of cation". Meanwhile, when a compound other than hydrogen fluoride (HF) is used as Component (A), calculation is carried out by using the sum of the molar concentration of cation derived from Component (A) and the molar concentration of cation derived Composition (B) as the "molar concentration of cation" above.

[Component (C): Alkylphosphonic Acids, Alkylphosphonate Esters, Alkyl Phosphate and Salts Thereof]

(C1) Alkylphosphonic Acids, Alkylphosphonate Esters and Salts Thereof

An alkylphosphonic acid used in the present invention is a $C_{4-13}$ alkylphosphonic acid having 4-13 carbon atoms (an alkylphosphonic acid having 4-13 carbon atoms). Such alkylphosphonic acids are known and commercially available (for example, available from Tokyo Chemical Industry Co., Ltd.). The alkylphosphonic acid is preferably a $C_{5-11}$ alkylphosphonic acid, more preferably a $C_{5-9}$ alkylphosphonic acid, and still more preferably a $C_{6-8}$ alkylphosphonic acid. While the alkyl moiety of the alkylphosphonic acid may be either linear or branched, it is preferably linear. If the alkyl moiety of the alkylphosphonic acid is branched, the number of the branched chains is preferably 5 or less, more preferably 3 or less, and particularly preferably 1.

In the aqueous composition of the present invention, an ester of the above-described alkylphosphonic acid may also be used. Specifically, an alkyl ester of the above-described $C_{4-13}$ alkylphosphonic acid (an alkylphosphonic acid having 4-13 carbon atoms) may also be used.

Where an alkylphosphonic acid can usually be represented by general formula $R_1P(=O)(OH)_2$ (wherein, $R_1$ is an alkyl group), an alkylphosphonate ester represented by general formula $R_1P(=O)(OR_2)_2$ (wherein, $R_1$ is an alkyl group, and $R_2$ is an alkyl group or a hydrogen atom: provided that at least one of the two $R_2$ is an alkyl group) can also be used in the aqueous composition.

Moreover, an alkylphosphonate ester as described herein also comprises an alkyl ester of a phosphonic acid (phosphonate ester). Specifically, a phosphonate ester represented by general formula $R_1P(=O)(OR_2)_2$ (wherein, $R_1$ is hydrogen, $R_2$ is an alkyl group or a hydrogen atom: provided that at least one of the two $R_2$ is an alkyl group) can also be used herein as the alkylphosphonate ester in the aqueous composition.

As can be appreciated from above, a compound represented by General formula (A) below is used as the alkylphosphonic acid or the alkylphosphonate ester in the aqueous composition.

$$R_1P(=O)(OR_2)_2 \tag{A}$$

(in General formula (A), $R_1$ and $R_2$ are each independently an alkyl group or a hydrogen atom: provided that at least one among $R_1$ and the two $R_2$ is an alkyl group).

The alkylphosphonate ester used in the present invention is a $C_{4-13}$ alkylphosphonate ester having a total of 4-13 carbon atoms (an alkylphosphonate ester having a total of 4-13 carbon atoms). The alkylphosphonate ester is preferably a $C_{5-11}$ alkylphosphonate ester, more preferably a $C_{5-9}$ alkylphosphonate ester and still more preferably a $C_{6-8}$ alkylphosphonate ester. Furthermore, the alkyl chains of $R_1$ and $R_2$ in General formula (A) above each independently have carbon atoms of preferably 4-12, more preferably 6-11 and still more preferably 8-10.

While the alkyl groups of the alkylphosphonate ester, namely, $R_1$ and $R_2$ in General formula (A) above, may be either linear or branched, they preferably contain linear alkyl groups.

In addition, the number of alkyl chains in General formula (A) above, namely, the total number of the alkyl chains of $R_1$ and $R_2$, is preferably 2 or less. Specifically, while an alkylphosphonate ester in which both of $R_1$ and $R_2$ in General formula (A) $R_1P(=O)(OR_2)_2$ above are alkyl groups can be used, an alkylphosphonate ester in which $R_1$ is an alkyl group while one or less of $R_2$ is an alkyl group, an alkylphosphonate ester in which $R_1$ is hydrogen while two or less of $R_2$ is an alkyl group, or the like may be used. Still more preferably, an alkylphosphonic acid having only a single alkyl chain, that is, only one among $R_1$ and the two $R_2$ in General formula (A) $R_1P(=O)(OR_2)_2$ above is an alkyl group, is used. Particularly preferably, an alkylphosphonate ester in which only $R_1$ in General formula (A) above is an alkyl group is used.

The salt of the alkylphosphonic acid used in the present invention is a salt of the above-described alkylphosphonic acid, which is, for example, an ammonium salt, a tetramethylammonium salt, a tetraethylammonium salt, a tetrapropylammonium salt, a tetrabutylammonium salt, a lithium salt, a sodium salt, a potassium salt, a rubidium salt, a cesium salt, a beryllium salt, a magnesium salt, a calcium salt, a strontium salt, a barium salt or the like.

Preferable examples of the alkylphosphonic acid or a salt thereof used in the present invention include n-butylphosphonic acid, n-pentylphosphonic acid, n-hexylphosphonic acid, n-heptylphosphonic acid, n-octylphosphonic acid, n-nonylphosphonic acid, n-decylphosphonic acid, n-undecylphosphonic acid, n-dodecylphosphonic acid, n-tridecylphosphonic acid, a salt thereof or a mixture thereof. More preferable examples of the alkylphosphonic acid or a salt thereof that can be used include n-pentylphosphonic acid, n-hexylphosphonic acid, n-heptylphosphonic acid, n-octylphosphonic acid, n-nonylphosphonic acid, n-decylphosphonic acid, n-undecylphosphonic acid, a salt thereof and a mixture thereof. In addition, a salt of the above-described alkylphosphonate ester can also be used in the aqueous composition of the present invention. Examples of the salt of the alkylphosphonate ester include those corresponding to salts of the above-described alkylphosphonic acids.

The concentration of the alkylphosphonic acid, the alkylphosphonate ester or the salt thereof in the aqueous composition can suitably be changed by considering the kind of the line material of the electronic device targeted for etching or cleaning and the kind of the masking material used in the etching step. The concentration of the alkylphosphonic acid, the alkylphosphonate ester or the salt thereof is preferably 0.0003-5 mass %, more preferably 0.0004-1 mass %, still more preferably 0.0005-0.1 mass % and particularly preferably 0.001-0.1 mass % with respect to the total amount of the composition.

(C2) Alkyl Phosphates and Salts Thereof

An alkyl phosphate used in the present invention is a $C_{4-13}$ alkyl phosphate having 4-13 carbon atoms (an alkyl phosphate having 4-13 carbon atoms). Such alkyl phosphates are known and commercially available (for example, available from Tokyo Chemical Industry Co., Ltd.). The alkyl phosphate is preferably a $C_{5-11}$ alkyl phosphate, more preferably a $C_{5-9}$ alkyl phosphate, and still more preferably a $C_{6-8}$ alkyl phosphate. While the alkyl moiety of the alkyl phosphate may be either linear or branched, it is preferably linear. If the alkyl moiety of the alkyl phosphate is branched, the number of the branched chains is preferably 5 or less, more preferably 3 or less, and particularly preferably 1.

Other than a monoalkyl ester of phosphoric acid, a dialkyl ester or a trialkyl ester of phosphoric acid may also be used as the alkyl phosphate in the aqueous composition of the present invention. Specifically, not only a monoalkyl ester of phosphoric acid represented by General formula $P(=O)(OR_3)_3$ (wherein, all of $R_3$ are hydrogen atoms) in which only one of $R_3$ is substituted with an alkyl group, but also a dialkyl ester in which two of $R_3$ are substituted with alkyl groups and a trialkyl ester in which all of $R_3$ are substituted with alkyl groups can be used in the aqueous composition of the present invention. However, the alkyl phosphate is preferably a dialkyl ester in which the number of alkyl chains is two or less (i.e., two of $R_3$ in General formula $P(=O)(OR_3)_3$ above are alkyl groups) or a monoalkyl ester (i.e., only one of $R_3$ in General formula $P(=O)(OR_3)_3$ above is an alkyl group), and more preferably a monoalkyl ester in which the number of the alkyl chain is 1. Specifically, the alkyl phosphate preferably has a single alkyl chain (an alkyl group represented by $R_3$ above).

Regardless of the number of ester bonds, the alkyl phosphate has a total of 4-13 carbon atoms. Regardless of the number of ester bonds, the alkyl phosphate is preferably a $C_{5-11}$ alkyl phosphate, more preferably a $C_{5-9}$ alkyl phosphate and still more preferably a $C_{6-8}$ alkyl phosphate.

Furthermore, the alkyl chain of $R_3$ in General formula $P(=O)(OR_3)_3$ above has carbon atoms of preferably 4-12, more preferably 6-11 and still more preferably 8-10. While the alkyl groups of the alkyl phosphate, namely, $R_3$ in General formula $P(=O)(OR_3)_3$ above, may be either linear or branched, they are preferably linear.

The salt of the alkyl phosphate used in the present invention is a salt of the above-described monoalkyl ester or dialkyl ester of phosphoric acid, which is, for example, an ammonium salt, a tetramethylammonium salt, a tetraethylammonium salt, a tetrapropylammonium salt, a tetrabutylammonium salt, a lithium salt, a sodium salt, a potassium salt, a rubidium salt, a cesium salt, a beryllium salt, a magnesium salt, a calcium salt, a strontium salt, a barium salt or the like.

Preferable examples of the alkyl phosphate or a salt thereof used in the present invention include n-butyl phosphate, n-pentyl phosphate, n-hexyl phosphate, n-heptyl phosphate, n-octyl phosphate, n-nonyl phosphate, n-decyl phosphate, n-undecyl phosphate, n-dodecyl phosphate, n-tridecyl phosphate, 2-ethylhexyl phosphate, isodecyl phosphate, a salt thereof and a mixture thereof.

More preferable examples of the alkyl phosphate or a salt thereof that can be used include n-pentyl phosphate, n-hexyl phosphate, n-heptyl phosphate, n-octyl phosphate, n-nonyl phosphate, n-decyl phosphate, n-undecyl phosphate, 2-ethylhexyl phosphate, isodecyl phosphate, a salt thereof and a mixture thereof.

The concentration of the alkyl phosphate or a salt thereof in the aqueous composition can suitably be changed by considering the kind of the line material of the electronic device targeted for etching or cleaning and the kind of the masking material used in the etching step. The concentration of the alkyl phosphate or a salt thereof is preferably 0.0003-5 mass %, more preferably 0.0004-1 mass %, still more preferably 0.0005-0.1 mass % and particularly preferably 0.001-0.1 mass % with respect to the total amount of the composition.

[Component (D): Water]

The composition of the present invention is aqueous and contains water as a diluent. While the water used in the present invention is not particularly limited, it is preferably water that has been removed of metal ions, organic impurities, particles and the like by distillation, an ion exchange treatment, a filter treatment, any adsorption treatment or the like, and is particularly preferably pure water or ultrapure water.

The amount of water contained in the composition is usually 40-99.9998 mass % and preferably, 89.5-99.998 mass %.

[Other Components]

If necessary, the aqueous composition of the present invention may be added with an additive that is conventionally used in aqueous compositions for semiconductors as long as it does not interfere with the purpose of the present invention.

For example, an acid, an alkali, a chelating agent, a surfactant, a defoamer, an oxidant, a reductant, an anti-corrosive agent for metals, a water-soluble organic solvent or the like may be added as additives. These additives are known and described, for example, in Japanese Unexamined Patent Application Publication (translation of PCT) No. 2013-533631.

[Method for Preparing Aqueous Composition (Liquid Composition)]

The aqueous composition (liquid composition) of the present invention can be prepared by agitating the above-described Component (A), the above-described Component (B), the above-described Component (C), water and other components as appropriate, until homogeneous.

The range of the pH of the aqueous composition is 2-6, preferably 2-5, more preferably 2-4 and still more preferably 2-3.

An aqueous composition in a preferred aspect of the present invention is capable of efficiently removing dry etch residues (for example, a zirconium-based dry etch residue, a titanium-based dry etch residue, a polymer-based dry etch residue, etc.) while preventing corrosion of an etch stop layer such as silicon nitride, an interlayer insulating film, a metal line material such as cobalt or a cobalt alloy and the like.

[Method of Using Aqueous Composition: Method for Cleaning/Producing Electronic Device]

When used as an aqueous composition for cleaning (hereinafter, also referred to as a "cleaning solution"), an aqueous composition of the present invention can remove dry etch residues by making contact with an electronic device (for example, a semiconductor substrate) in a wet etching step (or in a step prior to or following said step). As a method for bringing the composition into contact with the device, for example, a cleaning solution may be placed in a cleaning container so that an electronic device targeted for cleaning can be immersed in the cleaning solution to remove the dry etch residues, thereby cleaning the electronic device. Alternatively, an electronic device can be subjected to a treatment in a single-wafer cleaning mode to remove the dry etch residues, thereby cleaning the electronic device. Besides a dry etch residue removing solution (a cleaning solution), the aqueous cleaning composition can also favorably be used as an etching solution. In addition, the aqueous composition can also be used as a cleaning solution for cleaning the electronic device after a step of chemical-mechanical polishing (CMP).

Hence, an aqueous composition of the present invention may favorably be used in a cleaning method that comprises a step of cleaning an electronic device, and a method for producing an electronic device comprising such step.

The temperature of the cleaning solution of the present invention upon use is usually 10° C.-80° C., preferably 15° C.-70° C., more preferably 20° C.-65° C. and particularly preferably 20° C.-60° C. The temperature may suitably be selected according to the conditions of etching and the electronic device used (for example, a semiconductor element).

The cleaning solution of the present invention is usually used for 0.2-60 minutes. The time may suitably be selected according to the conditions of cleaning and the electronic device used (for example, a semiconductor element). A rinse solution used following the cleaning solution of the present invention may be an organic solvent, water, carbonated water or ammonia water.

[Electronic Devices Targeted for Cleaning/Production],

An electronic device targeted for cleaning and production employing the present invention is, for example, a semiconductor element or a display element, where a target for cleaning is usually an intermediate product that is obtained after a dry etching process. A semiconductor element or a display element is a substrate material such as silicon, amorphous silicon, polysilicon or glass, an insulating material such as silicon oxide, silicon nitride, silicon carbide or a derivative thereof, a material such as cobalt, a cobalt alloy, tungsten or titanium-tungsten, a compound semiconductor such as gallium-arsenic, gallium-phosphorus, indium-phosphorus, indium-gallium-arsenic or indium-aluminum-arsenic, or an oxide semiconductor such as chromium oxide. The electronic device targeted for cleaning by the present invention is particularly preferably an element using a cobalt or cobalt alloy line material, a zirconia-based hardmask and a low dielectric interlayer insulating film.

Dry etch residues targeted by the present invention are, for example, those that are generated upon forming a via or trench structure in a low dielectric interlayer insulating film by dry etching using a zirconia-based hardmask as a mask. Some of the dry etch residues are generated when etching gas makes contact with the zirconia-based hardmask. In this case, naturally, the targeted dry etch residue contains zirconium.

EXAMPLES

Hereinafter, the present invention will be described specifically by means of examples. The embodiments, however, can suitably be modified as long as the advantage of the present invention is attained.

Unless otherwise specified, "%" refers to "mass %".

[Wafers Used for Evaluation]

<Evaluation Wafer A>: Wafer for Evaluating Removal of Dry Etch Residue

Silicon nitride, an interlayer insulating film, silicon nitride, zirconia (hardmask) and a photoresist were sequentially formed from the bottom into a film, and then a photoresist was patterned thereon.

The predetermined part of the hardmask was removed by dry etching using the photoresist as a mask, and the photoresist was removed by oxygen plasma ashing. Furthermore, a via was formed in the silicon nitride and the interlayer insulating film by dry etching using the hardmask as a mask.

<Filmed Wafers>: Wafers for Evaluating Removal of Residues Using Zirconia and Damage to Silicon Nitride and Cobalt Wafers on which zirconia, silicon nitride or cobalt was formed into a film were prepared respectively under the following film forming conditions.

(1) Zirconia: formed into a film to a thickness of 1000 Å on Si by physical vapor deposition.

(2) Silicon nitride (SiN): formed into a film to a thickness of 1000 Å on Si by plasma-enhanced chemical vapor deposition.

(3) Cobalt: formed into a film to a thickness of 2000 Å on Si by physical vapor deposition.

[Evaluation Methods]

<Film Thickness>

The film thicknesses of the filmed wafers were measured using a x-ray fluorescence spectrometer SEA1200VX available from SII NanoTechnology (Film thickness measuring instrument A) or an optical film thickness gauge n&k 1280 available from n&k technology, Inc (Film thickness measuring instrument B). The film thicknesses of the zirconia-filmed wafer and the cobalt-filmed wafer were measured using Film thickness measuring instrument A while the thickness of the silicon nitride-filmed wafer was measured using Film thickness measuring instrument B.

<Evaluation of Removal of Residues>

Evaluation was carried out based on E.R. of zirconia at a temperature higher than the treatment temperature indicated in Table 1 by 20° C.

Evaluation Criteria:
A: 0.5 Å/min or more but less than 2.0 Å/min
B: 2.0 Å/min or more
C: Less than 0.5 Å/min Evaluations A and B were found to be acceptable.

<Evaluation of Prevention of Corrosion by Anticorrosive Material>

Evaluation was carried out based on E.R. of zirconia at a temperature higher than the treatment temperature indicated in Table 1 by 20° C.

Evaluation Criteria:

Those exceeding 4 Å/min were found to be inadequate (since they will damage the zirconia hardmask)

SiN: Evaluation was carried out by dividing E.R. of zirconia at a temperature higher than the treatment temperature indicated in Table 1 by 20° C. by E.R. of SiN at the treatment temperature indicated in Table 1.

Evaluation Criteria:
A: 2 or higher
B: 1 or higher but less than 2
B': 0.8 or higher but less than 1
C: Less than 0.8

Evaluations A, B and B' were found to be acceptable.

Co: Evaluation was carried out by dividing E.R. of zirconia at a temperature higher than the treatment temperature indicated in Table 1 by 20° C. by E.R. of cobalt at the treatment temperature indicated in Table 1.

Evaluation Criteria:
A: 1 or higher
B: 0.1 or higher but less than 1
C: Less than 0.1

Evaluations A and B were found to be acceptable.

<Measurement of pH Value>

The pH value of the aqueous composition in each of the examples and the comparative examples was measured at 25° C. using a pH meter (pH meter F-52 available from Horiba, Ltd.).

Examples 1-21 and Comparative Examples 1-7

The zirconia-, silicon nitride- and cobalt-filmed wafers were used for the test. The wafers were immersed in the aqueous compositions indicated in Table 1 at the treatment temperatures indicated in Table 1 or at a temperature higher than that by 20° C., and subsequently rinsed with ultrapure water and dried by dry nitrogen gas blowing.

The zirconia-, silicon nitride- and cobalt-filmed wafers were subjected to the immersion treatment for 30 minutes to calculate E.R. from the film thicknesses before and after the treatment.

In Examples 1-21, dry etch residues were found to be removed while preventing damage to silicon nitride and cobalt.

On the other hand, in Comparative examples 1-7 shown in Table 2, there were cases where damage to cobalt was not suppressed, and the dry etch residues were not removed while sufficiently preventing damage to silicon nitride.

TABLE 1

| | | Composition | | | | | | | | Evaluation | | | | | |
|---|---|---|---|---|---|---|---|---|---|---|---|---|---|---|---|
| | Treatment temperature/ | Fluoride ion supply source | | | Cation supply source | | | Alkylphosphonic acid or alkyl phosphate | | Water | | Zirconia E.R. | SiN E.R. | Cobalt E.R. | Zirconia E.R./ | Zirconia E.R./ |
| Example | °C. | Kind | Molar concentration (mmol/l) | Mass % | Kind | Molar concentration (mmol/l) | Mass % | Kind | Mass % | Mass % | pH | (Å/min) | (Å/min) | (Å/min) | SiN E.R. | Cobalt E.R. |
| 1 | 20 | HF | 1.0 | 0.02 | Ammonium nitrate | 0.63 | 0.05 | N-octylphosphonic acid | 0.01 | 99.92 | 2.7 | 1.0 | 1.0 | 0.8 | 1.0 | 1.3 |
| 2 | 20 | HF | 1.0 | 0.02 | Ammonium nitrate | 2.7 | 0.22 | N-octylphosphonic acid | 0.01 | 99.75 | 2.6 | 1.2 | 0.5 | 0.7 | 2.3 | 1.7 |
| 3 | 20 | HF | 1.0 | 0.02 | Ammonium nitrate | 7.5 | 0.6 | N-octylphosphonic acid | 0.01 | 99.37 | 2.6 | 1.1 | 0.5 | 0.3 | 2.1 | 3.4 |
| 4 | 20 | HF | 2.5 | 0.05 | Ammonium nitrate | 6.8 | 0.54 | N-octylphosphonic acid | 0.01 | 99.40 | 3.0 | 4.0 | 1.6 | 0.8 | 2.5 | 5.0 |
| 5 | 20 | HF | 1.0 | 0.02 | Potassium nitrate | 2.7 | 0.27 | N-octylphosphonic acid | 0.01 | 99.70 | 2.9 | 1.2 | 0.8 | 0.4 | 1.5 | 3.0 |
| 6 | 20 | HF | 1.0 | 0.02 | Potassium nitrate | 9.9 | 1.0 | N-octylphosphonic acid | 0.01 | 98.97 | 2.9 | 1.5 | 0.8 | 0.4 | 1.9 | 3.8 |
| 7 | 20 | HF | 1.0 | 0.02 | Potassium sulfate | 2.7 | 0.24 | N-octylphosphonic acid | 0.01 | 99.73 | 2.9 | 1.3 | 0.8 | 0.1 | 1.7 | 14 |
| 8 | 20 | HF | 1.0 | 0.02 | Potassium hexafluorophosphate | 2.7 | 0.5 | N-octylphosphonic acid | 0.01 | 99.47 | 2.9 | 1.4 | 0.8 | 0.1 | 1.8 | 14 |
| 9 | 20 | HF | 1.0 | 0.02 | Tetramethylammonium nitrate | 2.7 | 0.37 | N-octylphosphonic acid | 0.01 | 99.60 | 2.7 | 0.9 | 0.4 | 0.1 | 2.1 | 9.2 |
| 10 | 20 | HF | 1.0 | 0.02 | Lithium sulfate monohydrate | 2.7 | 0.15 | N-octylphosphonic acid | 0.01 | 99.82 | 2.8 | 0.7 | 0.4 | 0.8 | 1.7 | 0.9 |
| 11 | 20 | HF | 1.0 | 0.02 | Rubidium sulfate | 2.7 | 0.36 | N-octylphosphonic acid | 0.01 | 99.61 | 2.8 | 1.0 | 0.3 | 0.8 | 3.6 | 1.3 |
| 12 | 20 | HF | 1.0 | 0.02 | Sodium sulfate | 2.7 | 0.19 | N-octylphosphonic acid | 0.01 | 99.78 | 2.8 | 1.1 | 0.6 | 0.4 | 1.8 | 2.7 |
| 13 | 20 | HF | 20 | 0.4 | Potassium hydroxide | 1.9 | 1.1 | N-octylphosphonic acid | 0.01 | 98.17 | 5.5 | 1.9 | 1.5 | 0.1 | 1.3 | 19 |
| | | | | | Ammonium nitrate | 4.6 | 0.37 | | | | | | | | | |
| 14 | 20 | HF | 2.5 | 0.05 | Ammonium nitrate | 6.8 | 0.54 | N-hexylphosphonic acid | 0.1 | 99.31 | 3.0 | 3.4 | 2.3 | 0.2 | 1.5 | 17 |
| 15 | 20 | HF | 2.5 | 0.05 | Ammonium nitrate | 6.8 | 0.54 | N-decylphosphonic acid | 0.001 | 99.41 | 3.0 | 3.8 | 3.6 | 7.5 | 1.1 | 0.5 |
| 16 | 20 | HF | 2.5 | 0.05 | Ammonium nitrate | 6.8 | 0.54 | N-dodecyl phosphate | 0.001 | 99.41 | 3.0 | 2.1 | 1.7 | 3.8 | 1.2 | 0.6 |
| 17 | 20 | HF | 2.5 | 0.05 | Ammonium nitrate | 6.8 | 0.54 | N-dodecylphosphonic acid | 0.0005 | 99.41 | 3.0 | 1.4 | 0.8 | 12.1 | 1.8 | 0.1 |
| 18 | 40 | HF | 0.25 | 0.005 | Ammonium nitrate | 0.63 | 0.05 | N-octylphosphonic acid | 0.001 | 99.94 | 3.1 | 0.5 | 0.5 | 0.3 | 1.0 | 1.7 |
| 19 | 20 | HF | 1.0 | 0.02 | Ammonium nitrate | 0.63 | 0.05 | 2-Ethylhexyl phosphate | 0.01 | 99.92 | 2.9 | — | — | 0.1 | — | — |
| 20 | 20 | HF | 1.0 | 0.02 | Ammonium nitrate | 0.63 | 0.05 | Isodecyl phosphate | 0.01 | 99.92 | 2.9 | — | — | 0.1 | — | — |
| 21 | 20 | HF | 1.0 | 0.02 | Ammonium nitrate | 0.35 | 0.028 | N-octylphosphonic acid | 0.01 | 99.94 | 2.9 | 0.9 | 1.2 | — | 0.8 | — |

TABLE 2

| Comparative example | Treatment temperature/ ° C. | Composition | | | | | | | Alkylphosphonic acid or alkyl phosphate | |
|---|---|---|---|---|---|---|---|---|---|---|
| | | Fluoride ion supply source | | | Cation supply source | | | | | |
| | | Type | Molar concentration (mmol/l) | Mass % | Type | Molar concentration (mmol/l) | Mass % | | Type | Mass % |
| 1 | 20 | HF | 1.0 | 0.02 | | | | | N-octylphosphonic acid | 0.01 |
| 2 | 20 | HF | 2.5 | 0.05 | | | | | N-octylphosphonic acid | 0.01 |
| 3 | 20 | HF | 5.0 | 0.1 | | | | | N-octylphosphonic acid | 0.01 |
| 4 | 20 | HF | 1.0 | 0.02 | | | | | | |
| 5 | 20 | HF | 20 | 0.4 | Potassium hydroxide | 20 | 1.1 | | N-octylphosphonic acid | 0.01 |
| 6 | 20 | HF | 1.0 | 0.02 | Ammonium nitrate | 2.7 | 0.22 | | N-octylphosphonic acid | 0.01 |
| 7 | 20 | HF | 40 | 0.8 | Potassium hydroxide | 14 | 0.8 | | N-octylphosphonic acid | 0.01 |

| Comparative example | Composition | | Water | | Evaluation | | | Zirconia E.R./ SiN E.R. | Zirconia E.R./ Cobalt E.R. |
|---|---|---|---|---|---|---|---|---|---|
| | Others | | | | Zirconia E.R. (Å/min) | SiN E.R. (Å/mm) | Cobalt E.R. (Å/mm) | | |
| | Type | Mass % | Mass % | pH | | | | | |
| 1 | | | 99.97 | 2.9 | 0.7 | 1.5 | 0.6 | 0.5 | 1.1 |
| 2 | | | 99.94 | 3.0 | 2.5 | 3.7 | — | 0.7 | — |
| 3 | | | 99.89 | 3.1 | 6.7 | 4.0 | — | 1.7 | — |
| 4 | | | 99.98 | 3.0 | 1.3 | 1.0 | 64 | 1.3 | 0.02 |
| 5 | | | 98.49 | 6.2 | 0.1 | 0.1 | 0.2 | 1.0 | 0.5 |
| 6 | Nitric acid | 0.5 | 99.75 | 1.2 | 0.6 | 0.5 | 60 | 1.2 | 0.01 |
| 7 | | | 98.39 | 5.8 | 2.2 | 12.0 | 0.7 | 0.2 | 3.1 |

INDUSTRIAL APPLICABILITY

The aqueous composition in a preferred aspect of the present invention is capable of efficiently removing dry etch residues while preventing corrosion of an etch stop layer such as silicon nitride, an interlayer insulating film, a metal line material such as cobalt or a cobalt alloy and the like.

Since an etching solution, a cleaning solution and a cleaning method in a preferred aspect of the present invention have a favorable effect in preventing corrosion of an etch stop layer such as silicon nitride, an interlayer insulating film, a metal line material such as cobalt or a cobalt alloy and the like and have a favorable effect in removing dry etch residues, they allow production of a high precision, high quality electronic device such as a semiconductor element at high yield in a production process of said electronic device.

DESCRIPTION OF REFERENCE NUMERALS

1 Zirconia-based dry etch residue
2 Zirconia-based hardmask
3 Cobalt or cobalt alloy
5 Low dielectric interlayer insulating film
6 Silicon nitride (SiN)

The invention claimed is:
1. An aqueous composition, comprising:
(A) a fluoride ion supply source in an amount that gives a fluoride ion concentration in a range of from 0.05 to 30 mmol/L in the composition;
(B) a cation supply source in an amount that gives a mole ratio of cations in a range of from 0.3 to 20 to the fluoride ions in the composition; and
(C) 0.0001 to 10 mass % of a component comprising a $C_{4-13}$ alkylphosphonic acid, a $C_{4-13}$ alkylphosphonate ester, and/or a $C_{4-13}$ alkyl phosphate, optionally in salt form, with respect to total composition mass,
wherein the composition has a pH in a range of from 2 to 6.

2. The composition of claim 1, wherein the fluoride ion supply source (A) comprises hydrogen fluoride, ammonium fluoride, ammonium hydrogen fluoride, tetramethylammonium fluoride, tetraethyl ammonium fluoride, tetrapropylammonium fluoride, tetrabutylammonium fluoride, lithium fluoride, sodium fluoride, potassium fluoride, potassium bifluoride, rubidium fluoride, cesium fluoride, beryllium fluoride, magnesium fluoride, strontium fluoride, and/or barium fluoride.

3. The composition of claim 1, wherein the cation supply source (B) comprises a lithium compound, a sodium compound, a potassium compound, a rubidium compound, a cesium compound, a beryllium compound, a magnesium compound, a strontium compound, a barium compound, an ammonium compound, a tetramethylammonium compound, a tetraethylammonium compound, a tetrapropylammonium compound, and/or a tetrabutylammonium compound.

4. The composition of claim 1,
wherein the alkylphosphonic acid is present and comprises n-butylphosphonic acid, n-pentylphosphonic acid, n-hexylphosphonic acid, n-heptylphosphonic acid, n-octylphosphonic acid, n-nonylphosphonic acid, n-decylphosphonic acid, n-undecylphosphonic acid, n-dodecylphosphonic acid, and/or n-tridecylphosphonic acid, optionally in salt form, and/or
wherein the alkylphosphonate ester is present and comprises n-butylphosphonate ester, n-pentylphosphonate ester, n-hexylphosphonate ester, n-heptylphosphonate ester, n-octylphosphonate ester, n-nonylphosphonate ester, n-decylphosphonate ester, n-undecylphosphonate ester, n-dodecylphosphonate ester, and/or n-tridecylphosphonate ester, optionally as in salt form.

5. The composition of claim 1, wherein the alkyl phosphate is present and comprises
n-butyl phosphate, n-pentyl phosphate, n-hexyl phosphate, n-heptyl phosphate, n-octyl phosphate, n-nonyl phosphate, n-decyl phosphate, n-undecyl phosphate, n-dodecyl phosphate, n-tridecyl phosphate, 2-ethylhexyl phosphate, and/or isodecyl phosphate, optionally in salt form.

6. A method for cleaning an electronic device, the method comprising:
bringing the composition of claim 1 into contact with the electronic device.

7. A method for producing an electronic device, the method comprising:
bringing the composition of claim 1 into contact with the electronic device.

8. An etching solution, comprising the composition of claim 1.

9. A cleaning solution, comprising the composition of claim 1.

10. The composition of claim 1, having a fluoride ion concentration in a range of from 0.25 to 20 mmol/L in terms of hydrogen fluoride.

11. The composition of claim 1, having a fluoride ion concentration in a range of from 0.5 to 5 mmol/L in terms of hydrogen fluoride.

12. The composition of claim 1, having a fluoride ion concentration in a range of from 1.0 to 2.5 mmol/L in terms of hydrogen fluoride.

13. The composition of claim 1, wherein the mole ratio of the cations to the fluoride ions is in a range of from 0.5 to 10.

14. The composition of claim 1, wherein the mole ratio of the cations to the fluoride ions is in a range of from 0.6 to 8.

15. The composition of claim 1, wherein the cation supply source (B) is present in a range of from 0.020 to 2.00 mass % based on the total composition mass.

16. The composition of claim 1, wherein the cation supply source (B) is present in a range of from 0.025 to 1.50 mass % based on the total composition mass.

17. The composition of claim 1, wherein the cation supply source (B) is present in a range of from 0.05 to 1.0 mass % based on the total composition mass.

18. The composition of claim 1, comprising isodecyl phosphate, N-dodecyl phosphonic acid, N-decylphosphonic acid, N-octylphosphonic acid, 2-ethylhexyl phosphic acid, and/or N-hexylphosphonic acid, optionally in salt form.

* * * * *